(12) United States Patent
Yamaguchi

(10) Patent No.: US 6,404,368 B1
(45) Date of Patent: Jun. 11, 2002

(54) ANALOG AND DIGITAL ΔΣ MODULATOR

(75) Inventor: Motoi Yamaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/663,402

(22) Filed: Sep. 15, 2000

(30) Foreign Application Priority Data

Sep. 17, 1999 (JP) .......................................... 11-264006

(51) Int. Cl.[7] .............................................. H03M 3/00
(52) U.S. Cl. ....................................... 341/143; 341/155
(58) Field of Search ................................. 341/143, 155

(56) References Cited

U.S. PATENT DOCUMENTS

| | | | | |
|---|---|---|---|---|
| 4,439,756 A | * | 3/1984 | Shenoi et al. | 341/143 |
| 4,876,543 A | * | 10/1989 | Van Bavel | 341/143 |
| 5,148,166 A | * | 9/1992 | Ribner | 341/143 |
| 5,189,419 A | * | 2/1993 | Lyden | 341/143 |
| 5,208,594 A | * | 5/1993 | Yamazaki | 341/143 |
| 5,298,900 A | * | 3/1994 | Mauthe et al. | 341/143 |
| 5,329,282 A | * | 7/1994 | Jackson | 341/143 |
| 5,357,252 A | * | 10/1994 | Ledzius et al. | 341/143 |
| 5,659,314 A | * | 8/1997 | Tokura et al. | 341/143 |
| 5,682,160 A | * | 10/1997 | Ribner et al. | 341/143 |
| 5,757,299 A | * | 5/1998 | Noro et al. | 341/143 |
| 5,757,300 A | * | 5/1998 | Koilpillai et al. | 341/143 |
| 6,249,237 B1 | * | 6/2001 | Prater | 341/143 |
| 6,275,177 B1 | * | 8/2001 | Ho et al. | 341/143 |

FOREIGN PATENT DOCUMENTS

| | | |
|---|---|---|
| JP | 6-53836 | 2/1994 |
| JP | 7-143006 | 6/1995 |
| JP | 9-167967 | 6/1997 |
| JP | 9-307447 | 11/1997 |
| JP | 10-84282 | 3/1998 |
| JP | 11-17549 | 1/1999 |

* cited by examiner

*Primary Examiner*—Peguy Jeanpierre
*Assistant Examiner*—Jean Bruner JeanGlaude
(74) *Attorney, Agent, or Firm*—Scully, Scott, Murphy & Presser

(57) ABSTRACT

The ΔΣ modulator to be used in an over-sampling type analog-digital convertor, includes an analog ΔΣ modulator and a digital ΔΣ modulator. The analog ΔΣ modulator includes a digital-analog converter which converts a one-bit feed-back signal to an analog signal, an analog adder or subtracter which calculates a difference between an output signal transmitted from the digital-analog converter and an analog input signal, an analog integrator which integrates output signals transmitted from the analog adder or subtracter, and a first quantizer which converts an output signal transmitted from the analog integrator, into a digital signal. The digital ΔΣ modulator includes a digital adder or subtracter which calculates a difference between an output signal transmitted from the first quantizer and a one-bit feed-back signal, a digital integrator which integrates output signals transmitted from the digital adder or subtracter, a second quantizer which converts an output signal transmitted from the digital integrator, into a one-bit digital signal, and a delay element which delays an output signal transmitted from the second quantizer, and feeds the thus delayed output signal back to the analog ΔΣ modulator. The digital ΔΣ modulator is disposed downstream of the analog ΔΣ modulator and electrically connected in series to the analog ΔΣ modulator.

39 Claims, 7 Drawing Sheets

ANALOG AND DIGITAL ΔΣ MODULATOR

BACKGROUND OF THE INVENTION

1. Field of the Invention

The invention relates to a circuit for converting an analog signal into a digital signal, and more particularly to a ΔΣ modulator used in an analog-digital converting circuit which is of both an over-sampling type and a ΔΣ modulation type (or a noise-shaping type).

2. Description of the Related Art

A circuit for converting an analog signal into a digital signal which circuit is of both an over-sampling type and a ΔΣ modulation type has been conventionally used for digitizing a low frequency signal having a frequency of 22.1 kHz or smaller, such as an audio signal. In recent years, such an analog-digital converting circuit has been required to have a wider bandwidth with a high accuracy in order to be able to be applied to a modem used for cable communication, such as xDSL (Digital Scriber Line).

In order to meet such requirement, it would be necessary to keep high accuracy in a low over-sampling ratio. Hence, there is generally used a high-order ΔΣ modulator. Such a high-order ΔΣ modulator is suggested, for instance, in Japanese Unexamined Patent Publications Nos. 7-143006, 10-84282 and 11-17549.

An example of such a high-order ΔΣ modulator is illustrated in FIG. 1.

The illustrated ΔΣ modulator is comprised of a local digital-analog converter 61 which converts a feed-back signal into an analog signal, a plurality of analog adders 62 each of which calculates a difference between an output signal transmitted from the local digital-analog converter 61 and an analog input signal 60a or an output signal transmitted from an analog integrator disposed immediately upstream thereof, a plurality of analog integrators 63 each of which integrates an output signal transmitted from each of the analog adders 62, a quantizer 64 which converts an output signal transmitted from the final stage analog integrator 63, into a digital signal 60b, and a delay element 65 which delays an output signal transmitted from the quantizer 64 to generate a feed-back signal, and transmits the thus generated feed-back signal into the local digital-analog converter 61.

For instance, Japanese Unexamined Patent Publications Nos. 9-307447 and 3-117034 has suggested using a multi-bit quantizer.

FIG. 2 is a block diagram illustrating a structure of the ΔΣ modulator suggested in those Publications.

With reference to FIG. 2, the ΔΣ modulator is comprised of a local digital-analog converter 71 which converts a feed-back signal into an analog signal, a first analog adder 72 which calculates a difference between an output signal transmitted from the local digital-analog converter 71 and an analog input signal 70a, a first analog integrator 73 which integrates an output signal transmitted from the first analog adder 72, a second analog adder 74 which calculates a difference between an output signal transmitted from the first analog integrator 73 and an output signal transmitted from the digital-analog converter 71, a second analog integrator 75 which integrates an output signal transmitted from the second analog adder 74, a multi-bit quantizer 76 which converts an output signal transmitted from the second analog integrator 75, into a digital signal 70b, and a delay element 77 which delays an output signal transmitted from the quantizer 76 to generate a feed-back signal, and transmits the thus generated feed-back signal into the local digital-analog converter 71.

The ΔΣ modulator illustrated in FIG. 2 is designed to include the multi-bit quantizer 76 for enhancing a judgment level of a quantizer. As a result, it is possible in the ΔΣ modulator to reduce quantize noises generated in a quantizer, and keep conversion accuracy or linearity high with an over-sampling ratio being kept low.

However, the high-order ΔΣ modulator illustrated in FIG. 1 is accompanied with a problem that the number of analog circuits such as an operational amplifier and analog elements such as a capacitor is increased, resulting in an increase in a circuit area and power consumption.

In particular, an analog circuit and an analog element are more difficult to fabricate in small dimensions than a digital circuit. Hence, an analog circuit and an analog element are accompanied with a problem that an integrated circuit including a lot of analog circuit and element is quite difficult to fabricate in small dimensions.

The ΔΣ modulators suggested in Japanese Unexamined Patent Publications Nos. 9-307447 and 3-117034 are accompanied with a problem that a non-linear error generated in the local multi-bit digital-analog converting circuit 71 illustrated in FIG. 2 restricts an accuracy in conversion, that is, linearity in the ΔΣ modulator, and hence, the ΔΣ modulators are likely to be influenced by fluctuation in fabrication dimensions, resulting in that it is quite difficult to have high accuracy.

The local multi-bit digital-analog converting circuit 71 is generally necessary to include analog elements such as capacitors and resistors in the number equal to the number of bits. This means that the local multi-bit digital-analog converting circuit 71 is accompanied also with such a problem as mentioned above.

For instance, a circuit for converting an analog signal to a digital signal, suggested in Japanese Unexamined Patent Publication No. 6-53836, is designed to measure an error in conversion generated in a local digital-analog converting circuit by means of another analog-digital converting circuit, and compensates for the error by the analog-digital converting circuit.

However, the suggested analog-digital converting circuit is accompanied with a problem that the circuit is required to further include an analog-digital converting circuit having high accuracy for compensating for the conversion error, resulting in an increase in size and complexity of the circuit.

Japanese Unexamined Patent Publication No. 9-167967 has suggested an apparatus for converting an analog signal into a digital signal, which apparatus includes an analog-digital converter, a noise shaver converting an output signal transmitted from the analog-digital converter, into a one-bit signal, and suppressing quantize noises in the output signal, and a non-cyclic type digital filter converting a sampling frequency of an output signal transmitted from the noise shaver, and suppressing noises in the output signal.

In order to convert a digital output signal transmitted from the analog-digital converter, into a one-bit signal by means of the noise shaver, the apparatus is designed to include an AND gate as a multiplier for multiplying the digital output signal by a factor in the non-cyclic digital filter.

However, the apparatus is accompanied with a problem that it is unavoidable for the digital filter to be complicated in structure due to the AND gate.

SUMMARY OF THE INVENTION

In view of the above-mentioned problems in the prior ΔΣ modulators, it is an object of the present invention to provide a ΔΣ modulator which is capable of keeping high conversion accuracy or linearity with an over-sampling ratio being kept low, and reducing the number of analog elements.

In one aspect of the present invention, there is provided a ΔΣ modulator including (a) an analog ΔΣ modulator, (b) a digital ΔΣ modulator disposed downstream of the analog ΔΣ modulator and transmitting a one-bit signal, and (c) a delay element which delays the one-bit signal to produce a one-bit feed-back signal, and feeds the thus produced one-bit feedback signal back to the analog ΔΣ modulator.

It is preferable that the analog ΔΣ modulator includes a multi-bit quantizer.

For instance, the multi-bit quantizer may be comprised of comparators. For instance, the delay element may be comprised of a shift register.

There is further provided a ΔΣ modulator to be used in an over-sampling type analog-digital convertor, including (a) an analog ΔΣ modulator including (a1) at least one analog adder or subtracter, (a2) at least one analog integrator, and (a3) a quantizer which converts an analog signal to a digital code, and (b) a digital ΔΣ modulator including (b1) at least one digital adder or subtracter, (b2) at least one digital integrator, and (b3) a quantizer which converts a multi-bit digital code to a one-bit digital code, the digital ΔΣ modulator being disposed downstream of the analog ΔΣ modulator and electrically connected in series to the analog ΔΣ modulator.

There is still further provided a ΔΣ modulator to be used in an over-sampling type analog-digital convertor, including (a) an analog ΔΣ modulator including (a1) a digital-analog converter which converts a one-bit feed-back signal to an analog signal, (a2) an analog adder or subtracter which calculates a difference between an output signal transmitted from the digital-analog converter and an analog input signal, (a3) an analog integrator which integrates output signals transmitted from the analog adder or subtracter, and (a4) a first quantizer which converts an output signal transmitted from the analog integrator, into a digital signal, and (b) a digital ΔΣ modulator including (b1) a digital adder or subtracter which calculates a difference between an output signal transmitted from the first quantizer and a one-bit feed-back signal, (b2) a digital integrator which integrates output signals transmitted from the digital adder or subtracter, (b3) a second quantizer which converts an output signal transmitted from the digital integrator, into a one-bit digital signal, and (b4) a delay element which delays an output signal transmitted from the second quantizer, and feeds the thus delayed output signal back to the analog ΔΣ modulator, the digital ΔΣ modulator being disposed downstream of the analog ΔΣ modulator and electrically connected in series to the analog ΔΣ modulator.

It is preferable that the second quantizer is comprised of a one-bit quantizer. For instance, the one-bit quantizer may be comprised of a detector detecting a sign bit of the output signal transmitted from the digital integrator.

It is preferable that the ΔΣ modulator may further include (c) an additional digital adder or subtracter which calculates a difference between input and output signals of the second quantizer, (d) a circuit which digitizes an output signal transmitted from the additional digital adder or subtracter, and (e) a digital adder which adds an output signal transmitted from the circuit to an output signal transmitted from the first quantizer, and transmits a digital signal indicative of a sum of those output signals.

There is yet further provided a ΔΣ modulator to be used in an over-sampling type analog-digital convertor, including (a) an analog ΔΣ modulator including (a1) first to N-th digital-analog converters each of which converts a one-bit feed-back signal to an analog signal wherein N is an integer equal to or greater than 2, (a2) a first analog adder or subtracter which calculates a difference between an output signal transmitted from the first digital-analog converter and an analog input signal, (a3) a first analog integrator which integrates output signals transmitted from the first analog adder or subtracter, (a4) second to N-th analog adders or subtracters each of which calculates a difference between each of output signals transmitted from the second to N-th digital-analog converters and an output signal transmitted from an analog integrator disposed immediately upstream of the digital-analog converter, (a5) second to N-th analog integrators each of which integrates each of output signals transmitted from the second to N-th analog adders or subtracters, and (a6) a first quantizer which converts an output signal transmitted from the N-th analog integrator, into a digital signal, and (b) a digital ΔΣ modulator including (b1) a digital adder or subtracter which calculates a difference between an output signal transmitted from the first quantizer and a one-bit feed-back signal, (b2) a digital integrator which integrates output signals transmitted from the digital adder or subtracter, (b3) a second quantizer which converts an output signal transmitted from the digital integrator, into a one-bit digital signal, and (b4) a delay element which delays an output signal transmitted from the second quantizer, and feeds the thus delayed output signal back to the analog ΔΣ modulator, the digital ΔΣ modulator being, disposed downstream of the analog ΔΣ modulator and electrically connected in series to the analog ΔΣ modulator.

There is still yet further provided a ΔΣ modulator to be used in an over-sampling type analog-digital convertor, including (a) an analog ΔΣ modulator including (a1) a digital-analog converter which converts a one-bit feed-back signal to an analog signal, (a2) an analog adder or subtracter which calculates a difference between an output signal transmitted from the digital-analog converter and an analog input signal, (a3) an analog integrator which integrates output signals transmitted from the analog adder or subtracter, and (a4) a first quantizer which converts an output signal transmitted from the analog integrator, into a digital signal, and (b) a digital ΔΣ modulator including (b1) a first digital adder or subtracter which calculates a difference between an output signal transmitted from the first quantizer and a one-bit feed-back signal, (b2) second to M-th digital adders or subtracters each of which calculates a difference between an output signal transmitted from the digital integrator disposed immediately upstream of the digital adder or subtracter, wherein M is an integer equal to or greater than 3, (b3) first to M-th digital integrators each of which integrates each of output signals transmitted from the first to M-th digital adders or subtracters, (b4) a second quantizer which converts an output signal transmitted from the M-th digital integrator, into a one-bit digital signal, and (b5) a delay element which delays an output signal transmitted from the second quantizer, and feeds the thus delayed output signal back to the analog ΔΣ modulator, the digital ΔΣ modulator being disposed downstream of the analog ΔΣ modulator and electrically connected in series to the analog ΔΣ modulator.

There is further provided a ΔΣ modulator to be used in an over-sampling type analog-digital convertor, including (a) an analog ΔΣ modulator including (a1) first to N-th digital-analog converters each of which converts a one-bit feed-back signal to an analog signal wherein N is an integer equal to or greater than 2, (a2) a first analog adder or subtracter which calculates a difference between an output signal transmitted from the first digital-analog converter and an analog input signal, (a3) a first analog integrator which integrates output signals transmitted from the first analog adder or subtracter, (a4) second to N-th analog adders or subtracters each of which calculates a difference between each of output signals transmitted from the second to N-th digital-analog converters and an output signal transmitted from an analog integrator disposed immediately upstream of the digital-analog converter, (a5) second to N-th analog integrators each of which integrates each of output signals transmitted from the second to N-th analog adders or subtracters, and (a6) a first quantizer which converts an output signal transmitted from the N-th analog integrator, into a digital signal, and (b) a digital ΔΣ modulator including (b1) a first digital adder or subtracter which calculates a difference between an output signal transmitted from the first quantizer and a one-bit feed-back signal, (b2) second to M-th digital adders or subtracters each of which calculates a difference between an output signal transmitted from the digital integrator disposed immediately upstream of the digital adder or subtracter, wherein M is an integer equal to or greater than 3, (b3) first to M-th digital integrators each of which integrates each of output signals transmitted from the first to M-th digital adders or subtracters, (b4) a second quantizer which converts an output signal transmitted from the M-th digital integrator, into a one-bit digital signal, and (b5) a delay element which delays an output signal transmitted from the second quantizer, and feeds the thus delayed output signal back to the analog ΔΣ modulator, the digital ΔΣ modulator being disposed downstream of the analog ΔΣ modulator and electrically connected in series to the analog ΔΣ modulator.

In another aspect of the present invention, there is provided a circuit for converting an analog signal into a digital signal, including (a) any one of the above-mentioned ΔΣ modulators, (b) a pre-filter which filters an analog input signal and transmits the thus filtered analog input signal to the ΔΣ modulator, (c) a decimation filter which filters an output signal transmitted from the ΔΣ modulator and transmits a digital output signal, and (d) a clock signal generator, which supplies a clock signal to the ΔΣ modulator and the decimation filter.

The advantages obtained by the aforementioned present invention will be described hereinbelow.

First, since the ΔΣ modulator includes the multi-bit quantizer, it would be possible to reduce quantize noises generated in the analog ΔΣ modulator, and keep conversion accuracy or linearity high with an over-sampling ratio being kept low, without increasing an order of the analog ΔΣ modulator.

For instance, it is assumed that an over-sampling ratio is equal to 16. It would be necessary to prepare a third-order ΔΣ modulator in order to accomplish linearity corresponding to 10-bit accuracy, if a conventional one-bit quantizer is used. In contrast, if a four-bit quantizer is used, a second-order ΔΣ modulator could have linearity corresponding to ten- or more-bit accuracy.

Second, since an order of the analog ΔΣ modulator can be kept low, it would be possible to reduce the number of analog circuits and elements.

For instance, a second-order ΔΣ modulator includes analog adders, analog integrators and analog elements in the number equal to about ⅔ of the, number of those in a third-order ΔΣ modulator. As a result, an analog circuit in a second-order ΔΣ modulator could reduce an area to two-thirds of an area of an analog circuit in a third-order ΔΣ modulator.

Third, it is possible to use a non-bit local digital-analog converter which generates no non-linearity errors in the present invention. Hence, the ΔΣ modulator in accordance with the present invention is not influenced by fluctuation in fabrication dimensions, and is not necessary to include a circuit for compensating for linearity.

Fourth, since the one-bit local digital-analog converter does not need to include a lot of analog elements such as resistors and capacitors, it would be possible to reduce an area of an analog circuit in the ΔΣ modulator in accordance with the present invention in comparison with a conventional ΔΣmodulator including a multi-bit local digital-analog converter.

Fifth, one-bit quantize noises generated in the digital ΔΣ modulator can be reduced by virtue of high-order noise shaping in the digital ΔΣmodulator, or cancelled by digitizing. Accordingly, it would be possible to keep conversion accuracy or linearity high with an over-sampling ratio being kept low, without an increase in the number of analog circuits and elements.

Sixth, since the ΔΣ modulator outputs a one-bit signal as described in the later mentioned first and second embodiments, a decimation filter disposed downstream of the ΔΣ modulator can be simplified in structure. Hence, it would be possible to reduce an area of the decimation filter, and to shorten a time for designing the decimation filter.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

Figure 1:
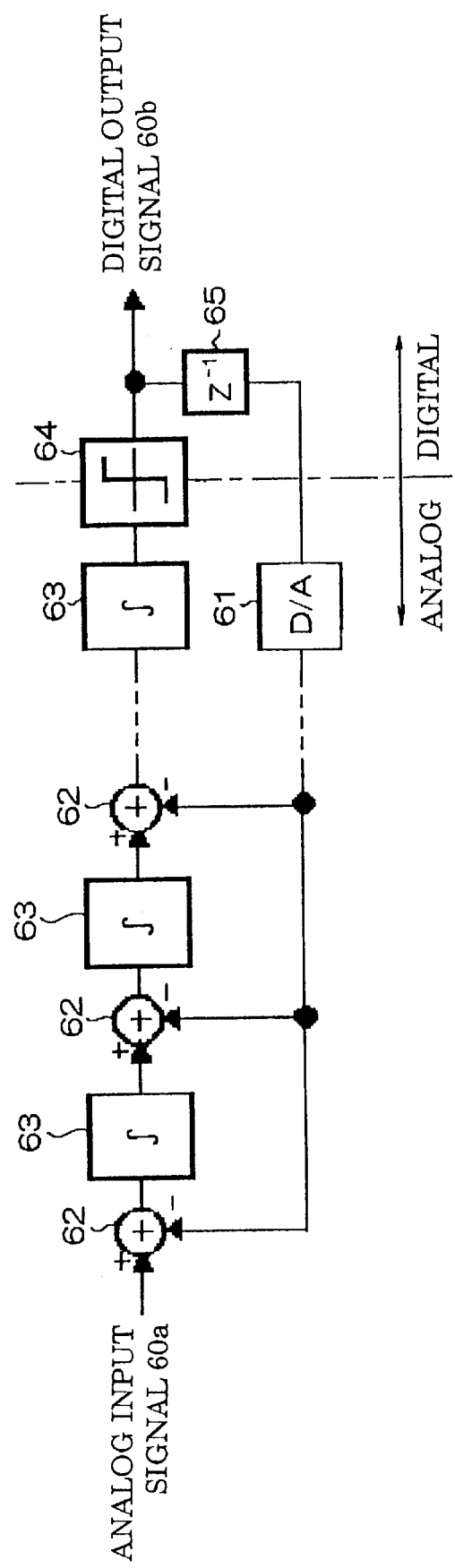
FIG. 1 is a block diagram of a conventional ΔΣ modulator including a multi-bit quantizer.
Figure 2:
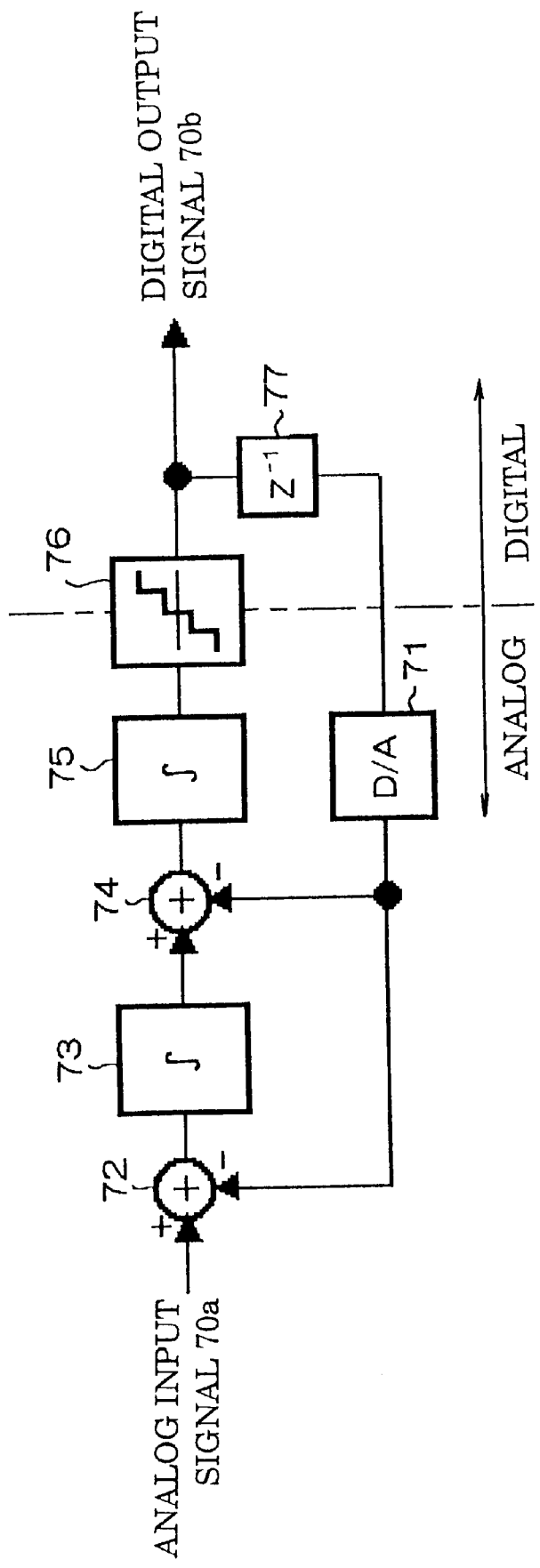
FIG. 2 is a block diagram of a conventional high-order ΔΣ modulator including a one-bit quantizer.
Figure 3:
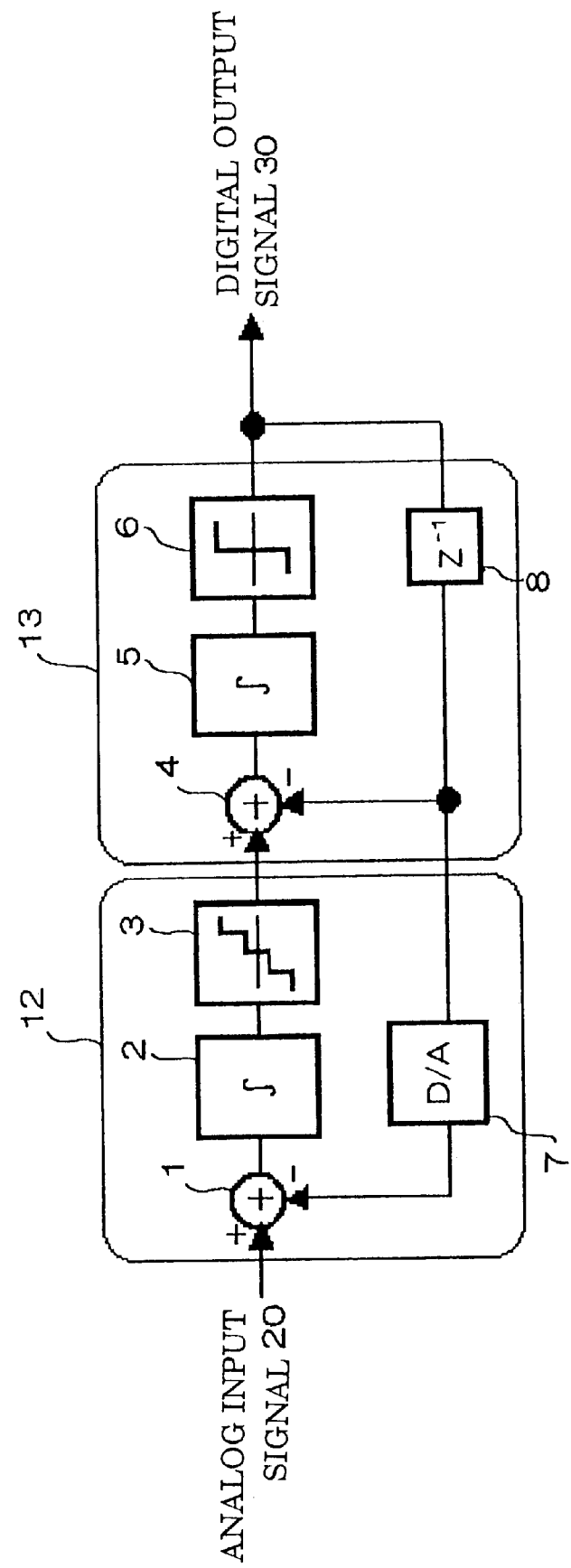
FIG. 3 is a block diagram of the ΔΣ modulator in accordance with the first embodiment of the present invention.

FIG. 3 is a block diagram of the ΔΣ modulator in accordance with the first embodiment.

The ΔΣ modulator in accordance with the first embodiment is comprised of an analog ΔΣ modulator 12 and a digital ΔΣ modulator 13 disposed downstream of the analog ΔΣ modulator 12 and electrically connected in series to the analog ΔΣ modulator 12.

The analog ΔΣ modulator 12 is comprised of a local digital-analog converter 7 which converts a one-bit feed-back signal transmitted from the digital ΔΣ modulator 13, into an analog signal, an analog adder 1 which calculates a difference between an analog signal transmitted from the local digital-analog converter 7 and an analog input signal 20 to be input into the ΔΣ modulator 12, an analog integrator 2 which integrates an output signal transmitted from the analog adder 1, and a multi-bit quantizer 3 which converts an output signal transmitted from the analog integrator 2, into a plurality of digital signals.

The digital ΔΣ modulator 13 is comprised of a digital adder 4 which calculates a difference between an output signal transmitted from the multi-bit quantizer 3 and the one-bit feed-back signal, a digital integrator 5 which integrates a digital output signal transmitted from the digital adder 4, a one-bit quantizer 6 which converts an output signal transmitted from the digital integrator 5, into a one-bit digital signal 30, and a delay element 8 which delays an output signal transmitted from the one-bit quantizer 6, and feeds the thus delayed output signal back to the analog ΔΣ modulator 12.

Figure 4:
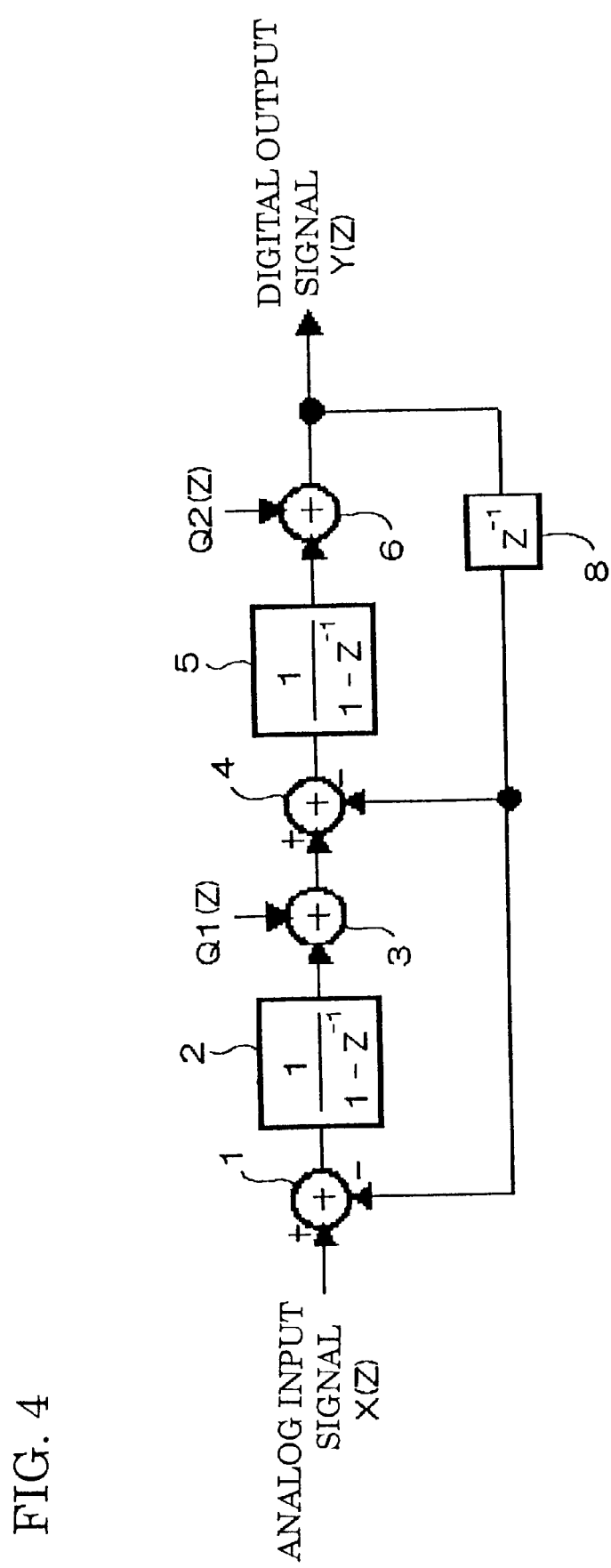
FIG. 4 is a signal flow-chart of the ΔΣ modulator illustrated in FIG. 3.

FIG. 4 is a signal flow-chart of the ΔΣ modulator illustrated in FIG. 3. In FIG. 4, respective blocks in the ΔΣ modulator are replaced with functions of Z-transformation.

In Z-transformation, the analog integrator 2 and the digital integrator 5 are both represented as follows.

$$1/(1-Z^{-1}) \quad\quad (A)$$

Herein, it is assumed that quantize noises generated in the multi-bit quantizer 3 are indicated by Q1(Z), and quantize noises generated in the one-bit quantizer 6 are indicated by Q2(Z). The multi-bit quantizer 3 is represented as an adder which adds the quantize noises Q1(Z) to an output signal transmitted from the analog integrator 2, and the one-bit quantizer 6 is represented as an adder which adds the quantize noises Q2(Z) to an output signal transmitted from the digital integrator 5.

In FIG. 4, a transfer function of the ΔΣ modulator in accordance with the first embodiment is represented with the equation (B), assuming that the analog input signal 20 is indicated as X(Z) and the digital output signal 30 is indicated as Y(Z).

$$Y(Z)=X(Z)+(1-Z^{-1})\times Q1(Z)+(1-Z^{-1})^2\times Q2(Z) \quad\quad (B)$$

In the equation (B), the second term $(1-Z^{-1})\times Q1(Z)$ and the third term $(1-Z^{-1})^2\times Q2(Z)$ indicate noises. The quantize noises Q1(Z) of the analog ΔΣ modulator 12 in the second term can be reduced by increasing a quantization level of the multi-bit quantizer 3. Since the quantize noises Q2(Z) of the digital quantizer 6 in the third term are secondarily differentiated, the quantize noises Q2(Z) is sufficiently attenuated in a signal bandwidth.

In the ΔΣ modulator in accordance with the first embodiment, since a feed-back signal to be transmitted to the analog ΔΣ modulator 12 is comprised of a one-bit output signal transmitted from the digital-analog converter 7, there is not generated signal distortion caused by non-linear error of the digital-analog converter 7.

The analog adder 1, the analog integrator 2, and the one-bit digital-analog converter 7 in the ΔΣ modulator in accordance with the first embodiment may be comprised of a switched capacitor integrator, for instance.

The digital adder 4 may be comprised of a conventional digital adder.

The digital integrator 5 may be comprised of an accumulator.

The multi-bit quantizer 3 may be comprised of a plurality of comparators, for instance.

The function of the one-bit quantizer 6, that is, the function of converting an output signal transmitted from the digital integrator 5, into a one-bit digital signal, may be accomplished by detecting a sign bit of an output signal transmitted from the digital integrator 5. It is not necessary to prepare an extra circuit for accomplishing the function of the one-bit quantizer 6.

The delay circuit 8 may be comprised of a shift register.

Though the ΔΣ modulator in accordance with the first embodiment is designed to include the analog adder 1 and the digital adder 4, it should be noted that they may be replaced with an analog subtracter and a digital subtracter.

Figure 5:
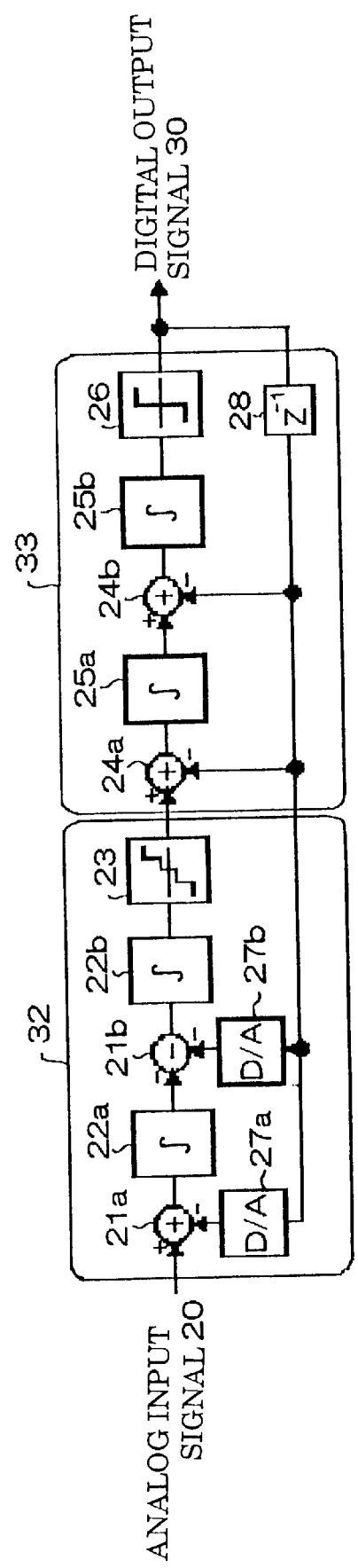
FIG. 5 is a block diagram of the ΔΣ modulator in accordance with the second embodiment of the present invention.

FIG. 5 is a block diagram of the ΔΣ modulator in accordance with the second embodiment. In the ΔΣ modulator in accordance with the second embodiment, the analog ΔΣ modulator 12 in the first embodiment is changed to a second-order analog ΔΣ modulator, and the digital ΔΣ modulator 13 is changed to a second-order digital ΔΣ modulator.

Specifically, the ΔΣ modulator in accordance with the second embodiment is comprised of an analog ΔΣ modulator 32, and a digital ΔΣ modulator 33 disposed downstream of the analog ΔΣ modulator 32 and electrically connected in series to the analog ΔΣ modulator 32.

The analog ΔΣ modulator 32 is comprised of first and second local digital-analog converters 27a and 27b each of which converts a one-bit feed-back signal transmitted from the digital ΔΣ modulator 33, into an analog signal, a first analog adder 21a which calculates a difference between an output signal transmitted from the first local digital-analog converter 27a and an analog input signal 20, a first analog integrator 22a which integrates an output signal transmitted from the first analog adder 21a, a second analog adder 21b which calculates a difference between an output signal transmitted from the second local digital-analog converter 27b and an output signal transmitted from the first analog integrator 22a, a second analog integrator 22b which integrates an output signal transmitted from the second analog adder 21b, and a multi-bit quantizer 23 which converts an output signal transmitted from the second analog integrator 22b, into a digital signal.

The digital ΔΣ modulator 33 is comprised of a first digital adder 24a which calculates a difference between an output signal transmitted from the multi-bit quantizer 23 and the one-bit feed-back signal, a first digital integrator 25a which integrates an output signal transmitted from the first digital adder 24a, a second digital adder 24b which calculates a difference between an output signal transmitted from the first digital integrator 25a and the one-bit feed-back signal, a second digital integrator 25b which integrates an output signal transmitted from the second digital adder 24b, a one-bit quantizer 26 which converts an output signal transmitted from the second digital 25b, into a one-bit digital signal 30, and a delay element 28 which delays an output signal transmitted from the one-bit quantizer 26, and feeds the thus delayed output signal back to the analog ΔΣ modulator 32.

A transfer function of the ΔΣ modulator in accordance with the second embodiment is represented with the equation (C).

$$Y(Z)=X(Z)+(1-Z^{-1})^2\times Q1(Z)+(1-Z^{-1})^4\times Q2(Z) \quad\quad (C)$$

As is obvious in view of the equation (C), since the quantize noises Q2(Z) of the one-bit quantizer 26 are biquadratically differentiated, the quantize noises Q2(Z) are sufficiently attenuated in a signal bandwidth.

Since the quantize noises Q1(Z) of the multi-bit quantizer 23 are secondarily differentiated, it would be possible to reduce noises to be included in an output Y(Z).

As a variant to the second embodiment, an order of the digital ΔΣ modulator 33 may be increased. By increasing an order of the digital ΔΣ modulator 33, it would be possible to reduce the quantize noises Q2(Z) of the one-bit quantizer 26 without increasing the number of analog circuits and elements.

Though the analog ΔΣ modulator 32 in the second embodiment is designed to include the two analog adders 21a and 21b and the two analog integrators 22a and 22b, the analog ΔΣ modulator 32 may be designed to include three or more analog adders and analog integrators. Similarly, though the digital ΔΣ modulator 33 in the second embodiment is designed to include the two digital adders 24a and 24b and the two digital integrators 25a and 25b, the digital ΔΣ modulator 33 may be designed to include three or more digital adders and digital integrators.

Figure 6:
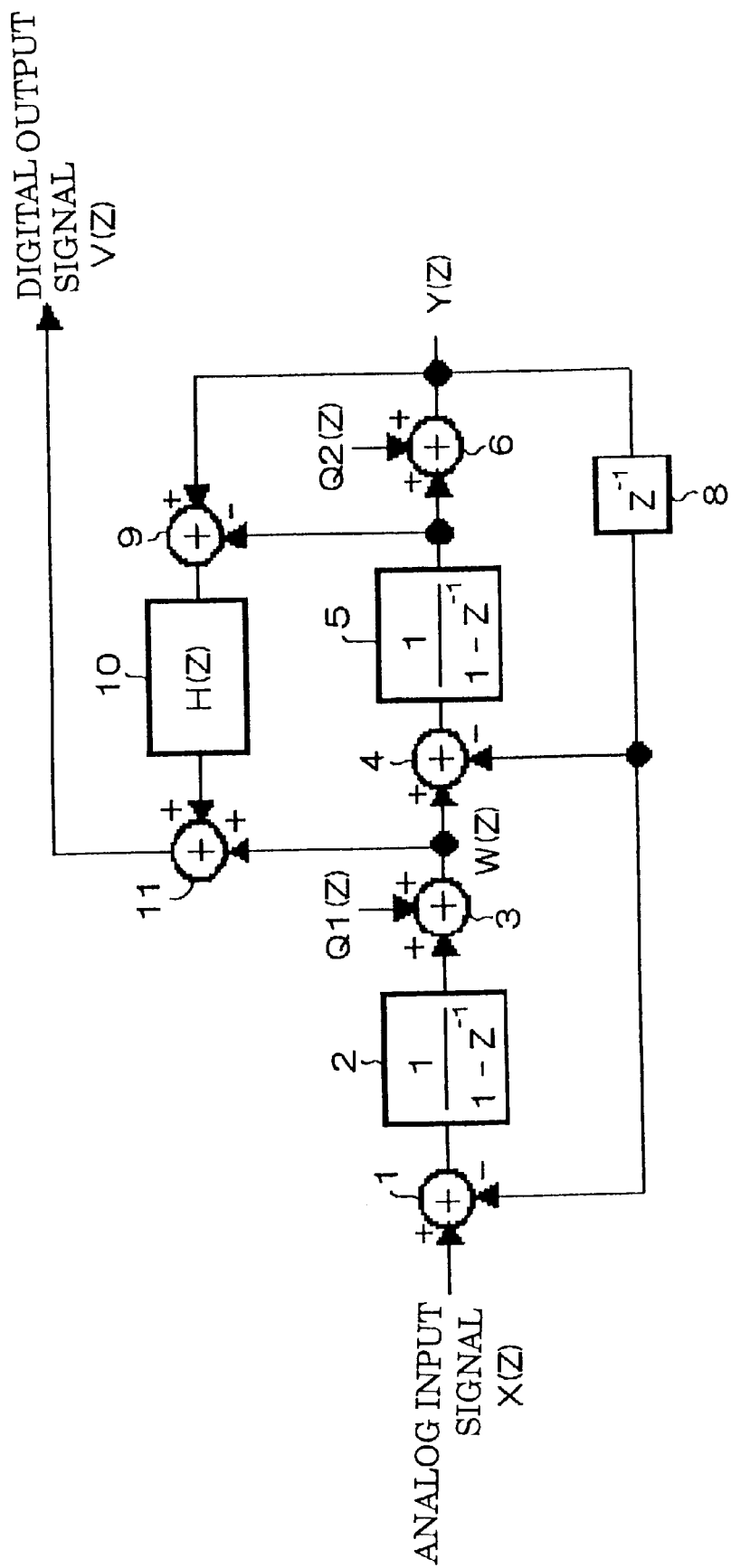
FIG. 6 is a block diagram of the ΔΣ modulator in accordance with the third embodiment of the present invention.

FIG. 6 is a block diagram of the ΔΣ modulator in accordance with the third embodiment of the present invention.

The ΔΣ modulator in accordance with the third embodiment is comprised, in comparison with the ΔΣ modulator in accordance with the first embodiment, further of a second digital adder 9 which calculates a difference between a signal to be input into the one-bit quantizer 6 or an output signal transmitted from the digital integrator 5, and an output signal transmitted from the one-bit quantizer 6, a circuit 10 for digitizing an output signal transmitted from the second digital adder 9, and a third digital adder 11 which adds an output signal transmitted from the circuit 10 and an output signal transmitted from the multi-bit quantizer 3.

An output W(Z) transmitted from the multi-bit quantizer 3 is represented as follows.

$$W(Z)=X(Z)+(1-Z^{-1})\times Q1(Z)-Z^{-1}(1-Z^{-1})\times Q2(Z) \quad (D)$$

Assuming that a transfer function H(Z) of digitizing carried out by the circuit 10 is represented with the equation (E), an output V(Z) transmitted from the digital adder 11 is represented with the equation (F).

$$H(Z)=Z^{-1}(1-Z^{-1}) \quad (E)$$

$$V(Z)=W(Z)-H(Z)\times Q2(Z)=X(Z)+(1-Z^{-1})\times Q1(Z) \quad (F)$$

Hence, assuming that the output V(Z) transmitted from the digital adder 11 is an output of the ΔΣ modulator in accordance with the third embodiment, the quantize noises Q2(Z) generated in the one-bit quantizer 6 are cancelled, resulting that the output of the ΔΣ modulator includes only the quantize noises Q1(Z) of the multi-bit quantizer 3.

Figure 7:
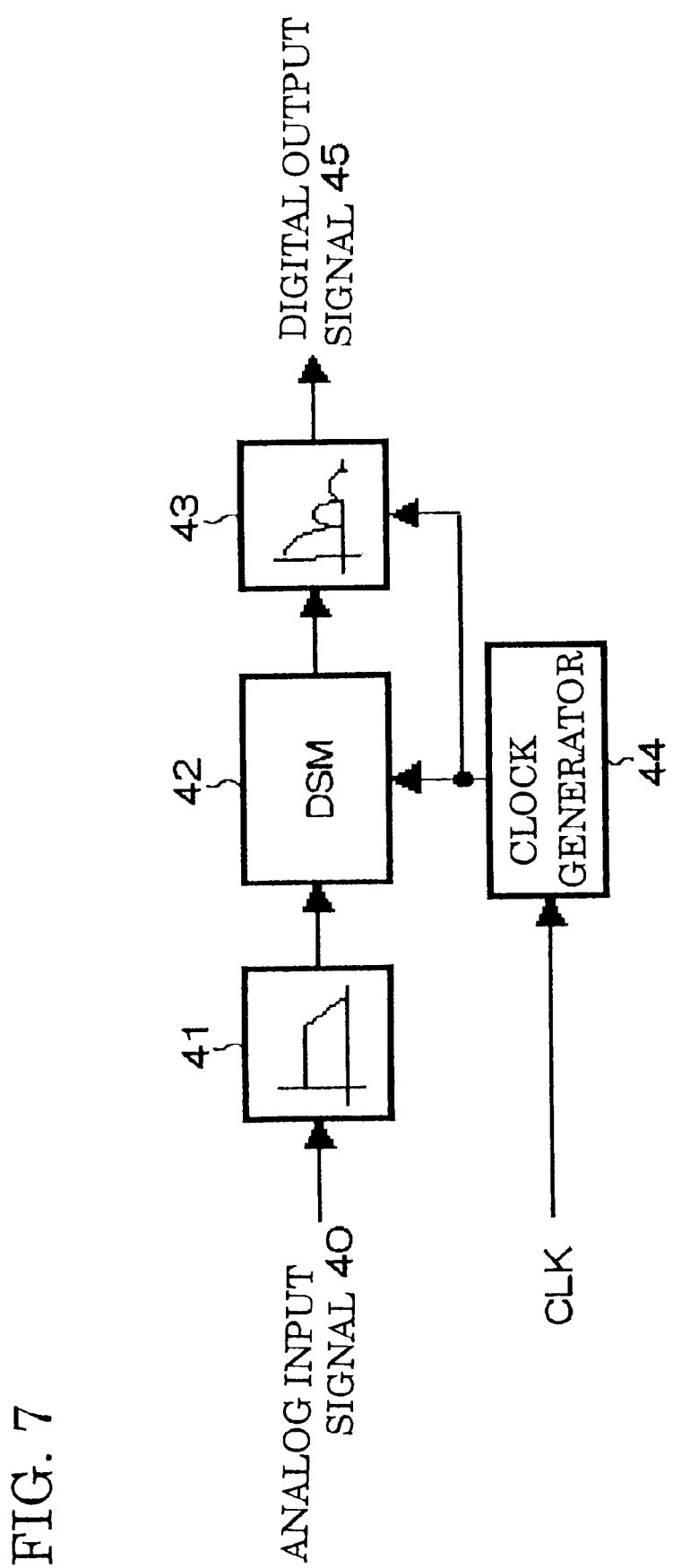
FIG. 7 is a block diagram of a circuit for converting an analog signal into a digital signal, including the ΔΣ modulator in accordance with the present invention.

FIG. 7 is a block diagram of an analog-digital converting circuit to which the ΔΣ modulator in accordance with any one of the above-mentioned first to third embodiments is applied.

The illustrated analog-digital converting circuit is comprised of a ΔΣ modulator 42 in accordance with any one of the first to third embodiments, a prefilter 41 which filters an analog input signal 40 and transmits the thus filtered analog input signal 40 to the ΔΣ modulator 42, a decimation filter 43 which filters an output signal transmitted from the ΔΣ modulator 42 and transmits a digital output signal 45, and a clock signal generator 44 which supplies a clock signal to both the ΔΣ modulator 42 and the decimation filter 43.

The pre-filter 41 is comprised of an analog low-pass filter.

The decimation filter 43 is comprised of a digital low-pass filter.

The clock generator 44 is comprised of a phase-locked loop (PLL) circuit or a clock driver which generates a sampling clock, based on a reference clock signal CLK.

The decimation filter 43 multiplies an output signal transmitted from the ΔΣ modulator 42, by a filter coefficient, and cumulatively adds the products. If the ΔΣ modulator 42 transmits a multi-bit output signal, it would be necessary for the decimation filter 43 to include a multi-bit multiplier as a coefficient multiplier, resulting in an increase in a size of the decimation filter 43. However, the ΔΣ modulator 22 transmits one-bit data in the first and second embodiments, ensuring that a coefficient multiplier to be included in the decimation filter 43 could be simplified in structure.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-264006 filed on Sep. 17, 1999 including specification, claims, drawings and summary is incorporated herein by reference in its entirety.

What is claimed is:

1. A ΔΣ modulator comprising:
   (a) an analog ΔΣ modulator;
   (b) a digital ΔΣ modulator disposed downstream of said analog ΔΣ modulator and transmitting a one-bit signal; and
   (c) a delay element which delays said one-bit signal to produce a one-bit feed-back signal, and feeds the thus produced one-bit feed-back signal back to said analog ΔΣ modulator.

2. The ΔΣ modulator as set forth in claim 1, wherein said analog ΔΣ modulator includes a multi-bit quantizer.

3. The ΔΣ modulator as set forth in claim 2, wherein said multi-bit quantizer is comprised of comparators.

4. The ΔΣ modulator as set forth in claim 1, wherein said delay element is comprised of a shift register.

5. A ΔΣ modulator to be used in an over-sampling type analog-digital convertor, comprising:
   (a) an analog ΔΣ modulator including (a1) at least one analog adder or subtracter, (a2) at least one analog integrator, and (a3) a quantizer which converts an analog signal to a digital code; and
   (b) a digital ΔΣ modulator including (b1) at least one digital adder or subtracter, (b2) at least one digital integrator, and (b3) a quantizer which converts a multi-bit digital code to a one-bit digital code, said digital ΔΣ modulator being disposed downstream of said analog ΔΣ modulator and electrically connected in series to said analog ΔΣ modulator.

6. A ΔΣ modulator to be used in an over-sampling type analog-digital convertor, comprising:
   (a) an analog ΔΣ modulator including:
      (a1) a digital-analog converter which converts a one-bit feed-back signal to an analog signal;
      (a2) an analog adder or subtracter which calculates a difference between an output signal transmitted from said digital-analog converter and an analog input signal;
      (a3) an analog integrator which integrates output signals transmitted from said analog adder or subtracter; and (a4) a first quantizer which converts an output signal transmitted from said analog integrator, into a digital signal, and (b) a digital ΔΣ modulator including:

(b1) a digital adder or subtracter which calculates a difference between an output signal transmitted from said first quantizer and a one-bit feed-back signal;

(b2) a digital integrator which integrates output signals transmitted from said digital adder or subtracter;

(b3) a second quantizer which converts an output signal transmitted from said digital integrator, into a one-bit digital signal; and (b4) a delay element which delays an output signal transmitted from said second quantizer, and feeds the thus delayed output signal back to said analog ΔΣ modulator, said digital ΔΣ modulator being disposed downstream of said analog ΔΣ modulator and electrically connected in series to said analog ΔΣ modulator.

7. The ΔΣ modulator as set forth in claim 6, wherein said first quantizer is comprised of a multi-bit quantizer.

8. The ΔΣ modulator as set forth in claim 7, wherein said multi-bit quantizer is comprised of comparators.

9. The ΔΣ modulator as set forth in claim 6, wherein said second quantizer is comprised of a one-bit quantizer.

10. The ΔΣ modulator as set forth in claim 9, wherein said one-bit quantizer is comprised of a detector detecting a sign bit of said output signal transmitted from said digital integrator.

11. The ΔΣ modulator as set forth in claim 6, wherein said delay element is comprised of a shift register.

12. The ΔΣ modulator as set forth in claim 6, further comprising:

(c) an additional digital adder or subtracter which calculates a difference between input and output signals of said second quantizer;

(d) a circuit which digitizes an output signal transmitted from said additional digital adder or subtracter; and (e) a digital adder which adds an output signal transmitted from said circuit to an output signal transmitted from said first quantizer, and transmits a digital signal indicative of a sum of those output signals.

13. A ΔΣ modulator to be used in an over-sampling type analog-digital convertor, comprising:

(a) an analog ΔΣ modulator including:

(a1) first to N-th digital-analog converters each of which converts a one-bit feed-back signal to an analog signal wherein N is an integer equal to or greater than 2;

(a2) a first analog adder or subtracter which calculates a difference between an output signal transmitted from said first digital-analog converter and an analog input signal;

(a3) a first analog integrator which integrates output signals transmitted from said first analog adder or subtracter;

(a4) second to N-th analog adders or subtracters each of which calculates a difference between each of output signals transmitted from said second to N-th digital-analog converters and an output signal transmitted from an analog integrator disposed immediately upstream of the digital-analog converter;

(a5) second to N-th analog integrators each of which integrates each of output signals transmitted from said second to N-th analog adders or subtracters; and (a6) a first quantizer which converts an output signal transmitted from said N-th analog integrator, into a digital signal, and (b) a digital ΔΣ modulator including:

(b1) a digital adder or subtracter which calculates a difference between an output signal transmitted from said first quantizer and a one-bit feed-back signal;

(b2) a digital integrator which integrates output signals transmitted from said digital adder or subtracter;

(b3) a second quantizer which converts an output signal transmitted from said digital integrator, into a one-bit digital signal; and (b4) a delay element which delays an output signal transmitted from said second quantizer, and feeds the thus delayed output signal back to said analog ΔΣ modulator, said digital ΔΣ modulator being disposed downstream of said analog ΔΣ modulator and electrically connected in series to said analog ΔΣ modulator.

14. The ΔΣ modulator as set forth in claim 13, wherein said first quantizer is comprised of a multi-bit quantizer.

15. The ΔΣ modulator as set forth in claim 14, wherein said multi-bit quantizer is comprised of comparators.

16. The ΔΣ modulator as set forth in claim 13, wherein said second quantizer is comprised of a one-bit quantizer.

17. The ΔΣ modulator as set forth in claim 16, wherein said one-bit quantizer is comprised of a detector detecting a sign bit of said output signal transmitted from said digital integrator.

18. The ΔΣ modulator as set forth in claim 13, wherein said delay element is comprised of a shift register.

19. The ΔΣ modulator as set forth in claim 13, further comprising:

(c) an additional digital adder or subtracter which calculates a difference between input and output signals of said second quantizer;

(d) a circuit which digitizes an output signal transmitted from said additional digital adder or subtracter; and (e) a digital adder which adds an output signal transmitted from said circuit to an output signal transmitted from said first quantizer, and transmits a digital signal indicative of a sum of those output signals.

20. A ΔΣ modulator to be used in an over-sampling type analog-digital convertor, comprising:

(a) an analog ΔΣ modulator including:

(a1) a digital-analog converter which converts a one-bit feed-back signal to analog signal;

(a2) an analog adder or subtracter which calculates a difference between an output signal transmitted from said digital-analog converter and an analog input signal;

(a3) an analog integrator which integrates output signals transmitted from said analog adder or subtracter; and (a4) a first quantizer which converts an output signal transmitted from said analog integrator, into a digital signal, and (b) a digital ΔΣ modulator including:

(b1) a first digital adder or subtracter which calculates a difference between an output signal transmitted from said first quantizer and a one-bit feed-back signal;

(b2) second to M-th digital adders or subtracters each of which calculates a difference between an output signal transmitted from the digital integrator disposed immediately upstream of the digital adder or subtracter, wherein M is an integer equal to or greater than 3;

(b3) first to M-th digital integrators each of which integrates each of output signals transmitted from said first to M-th digital adders or subtracters;

(b4) a second quantizer which converts an output signal transmitted from said M-th digital integrator, into a one-bit digital signal; and (b5) a delay element which delays an output signal transmitted from said second quantizer, and feeds the thus delayed output signal back to said analog ΔΣ modulator, said digital ΔΣ modulator being disposed downstream of said analog ΔΣ modulator and electrically connected in series to said analog ΔΣ modulator.

21. The ΔΣ modulator as set forth in claim 20, wherein said first quantizer is comprised of a multi-bit quantizer.

22. The ΔΣ modulator as set forth in claim 21, wherein said multi-bit quantizer is comprised of comparators.

23. The ΔΣ modulator as set forth in claim 20, wherein said second quantizer is comprised of a one-bit quantizer.

24. The ΔΣ modulator as set forth in claim 23, wherein said one-bit quantizer is comprised of a detector detecting a sign bit of said output signal transmitted from said M-th digital integrator.

25. The ΔΣ modulator as set forth in claim 20, wherein said delay element is comprised of a shift register.

26. The ΔΣ modulator as set forth in claim 20, further comprising:

(c) an additional digital adder or subtracter which calculates a difference between input and output signals of said second quantizer;

(d) a circuit which digitizes an output signal transmitted from said additional digital adder or subtracter; and (e) a digital adder which adds an output signal transmitted from said circuit to an output signal transmitted from said first quantizer, and transmits a digital signal indicative of a sum of those output signals.

27. A ΔΣ modulator to be used in an over-sampling type analog-digital convertor, comprising:

(a) an analog ΔΣ modulator including:

(a1) first to N-th digital-analog converters each of which converts a one-bit feed-back signal to an analog signal wherein N is an integer equal to or greater than 2;

(a2) a first analog adder or subtracter which calculates a difference between an output signal transmitted from said first digital-analog converter and an analog input signal;

(a3) a first analog integrator which integrates output signals transmitted from said first analog adder or subtracter;

(a4) second to N-th analog adders or subtracters each of which calculates a difference between each of output signals transmitted from said second to N-th digital-analog converters and an output signal transmitted from an analog integrator disposed immediately upstream of the digital-analog converter;

(a5) second to N-th analog integrators each of which integrates each of output signals transmitted from said second to N-th analog adders or subtracters; and (a6) a first quantizer which converts an output signal transmitted from said N-th analog integrator, into a digital signal, and (b) a digital ΔΣ modulator including:

(b1) a first digital adder or subtracter which calculates a difference between; an output signal transmitted from said first quantizer and a one-bit feed-back signal;

(b2) second to M-th digital adders or subtracters each of which calculates a difference between an output signal transmitted from the digital integrator disposed immediately upstream of the digital adder or subtracter, wherein M is an integer equal to or greater than 3;

(b3) first to M-th digital integrators each of which integrates each of output signals transmitted from said first to M-th digital adders or subtracters;

(b4) a second quantizer which converts an output signal transmitted from said M-th digital integrator, into a one-bit digital signal; and (b5) a delay element which delays an output signal transmitted from said second quantizer, and feeds the thus delayed output signal back to said analog ΔΣ modulator, said digital ΔΣ modulator being disposed downstream of said analog ΔΣ modulator and electrically connected in series to said analog ΔΣ modulator.

28. The ΔΣ modulator as set forth in claim 27, wherein said first quantizer is comprised of a multi-bit quantizer.

29. The ΔΣ modulator as set forth in claim 28, wherein said multi-bit quantizer is comprised of comparators.

30. The ΔΣ modulator as set forth in claim 27, wherein said second quantizer is comprised of a one-bit quantizer.

31. The ΔΣ modulator as set forth in claim 30, wherein said one-bit quantizer is comprised of a detector detecting a sign bit of said output signal transmitted from said M-th digital integrator.

32. The ΔΣ modulator as set forth in claim 27, wherein said delay element is comprised of a shift register.

33. The ΔΣ modulator as set forth in claim 27, further comprising:

(c) an additional digital adder or subtracter which calculates a difference between input and output signals of said second quantizer;

(d) a circuit which digitizes an output signal transmitted from said additional digital adder or subtracter; and (e) a digital adder which adds an output signal transmitted from said circuit to an output signal transmitted from said first quantizer, and transmits a digital signal indicative of a sum of those output signals.

34. A circuit for converting an analog signal into a digital signal, comprising:

(a) a ΔΣ modulator;

(b) a pre-filter which filters an analog input signal and transmits the thus filtered analog input signal to said ΔΣ modulator;

(c) a decimation filter which filters an output signal transmitted from said ΔΣ modulator and transmits a digital output signal; and (d) a clock signal generator which supplies a clock signal to said ΔΣ modulator and said decimation filter, said ΔΣ modulator comprising:

(a) an analog ΔΣ modulator;

(b) a digital ΔΣ modulator disposed downstream of said analog ΔΣ modulator and transmitting a one-bit signal; and (c) a delay element which delays said one-bit signal to produce a one-bit feed-back signal, and feeds the thus produced one-bit feed-back signal back to said analog ΔΣ modulator.

35. A circuit for converting an analog signal into a digital signal, comprising:

(a) a ΔΣ modulator;

(b) a pre-filter which filters an analog input signal and transmits the thus filtered analog input signal to said ΔΣ modulator;

(c) a decimation filter which filters an output signal transmitted from said ΔΣ modulator and transmits a digital output signal; and (d) a clock signal generator which supplies a clock signal to said ΔΣ modulator and said decimation filter, said ΔΣ modulator comprising:

(a) an analog ΔΣ modulator including (a1) at least one analog adder or subtracter, (a2) at least one analog integrator, and (a3) a quantizer which converts an analog signal to a digital code; and (b) a digital ΔΣ modulator including (b1) at least one digital adder or subtracter, (b2) at least one digital integrator, and (b3) a quantizer which converts a multibit digital code to a one-bit digital code, said digital ΔΣ modulator being disposed downstream of said analog ΔΣ modulator and electrically connected in series to said analog ΔΣ modulator.

36. A circuit for converting an analog signal into a digital signal, comprising:

(a) a ΔΣ modulator;

(b) a pre-filter which filters an analog input signal and transmits the thus filtered analog input signal to said ΔΣ modulator;

(c) a decimation filter which filters an output signal transmitted from said ΔΣ modulator and transmits a digital output signal; and (d) a clock signal generator which supplies a clock signal to said ΔΣ modulator and said decimation filter, said ΔΣ modulator comprising:

(a) an analog ΔΣ modulator including:

(a1) a digital-analog converter which converts a one-bit feed-back signal to an analog signal;

(a2) an analog adder or subtracter which calculates a difference between an output signal transmitted from said digital-analog converter and an analog input signal;

(a3) an analog integrator which integrates output signals transmitted from said analog adder or subtracter; and (a4) a first quantizer which converts an output signal transmitted from said analog integrator, into a digital signal, and (b) a digital ΔΣ modulator including:

(b1) a digital adder or subtracter which calculates a difference between an output signal transmitted from said first quantizer and a one-bit feed-back signal;

(b2) a digital integrator which integrates output signals transmitted from said digital adder or subtracter;

(b3) a second quantizer which converts an output signal transmitted from said digital integrator, into a one-bit digital signal; and (b4) a delay element which delays an output signal transmitted from said second quantizer, and feeds the thus delayed output signal back to said analog ΔΣ modulator, said digital ΔΣ modulator being disposed downstream of said analog ΔΣ modulator and electrically connected in series to said analog ΔΣ modulator.

37. A circuit for converting an analog signal into a digital signal, comprising:

(a) a ΔΣ modulator;

(b) a pre-filter which filters an analog input signal and transmits the thus filtered analog input signal to said ΔΣ modulator;

(c) a decimation filter which filters an output signal transmitted from said ΔΣ modulator and transmits a digital output signal; and (d) a clock signal generator which supplies a clock signal to said ΔΣ modulator and said decimation filter, said ΔΣ modulator comprising:

(a) an analog ΔΣ modulator including:

(a1) first to N-th digital-analog converters each of which converts a one-bit feed-back signal to an analog signal wherein N is an integer equal to or greater than 2;

(a2) a first analog adder or subtracter which calculates a difference between an output signal transmitted from said first digital-analog converter and an analog input signal;

(a3) a first analog integrator which integrates output signals transmitted from said first analog adder or subtracter;

(a4) second to N-th analog adders or subtracters each of which calculates a difference between each of output signals transmitted from said second to N-th digital-analog converters and an output signal transmitted from an analog integrator disposed immediately upstream of the digital-analog converter;

(a5) second to N-th analog integrators each of which integrates each of output signals transmitted from said second to N-th analog adders or subtracters; and (a6) a first quantizer which converts an output signal transmitted from said N-th analog integrator, into a digital signal, and (b) a digital ΔΣ modulator including:

(b1) a digital adder or subtracter which calculates a difference between an output signal transmitted from said first quantizer and a one-bit feed-back signal;

(b2) a digital integrator which integrates output signals transmitted from said digital adder or subtracter;

(b3) a second quantizer which converts an output signal transmitted from said digital integrator, into a one-bit digital signal; and (b4) a delay element which delays an output signal transmitted from said second quantizer, and feeds the thus delayed output signal back to said analog ΔΣ modulator, said digital ΔΣ modulator being disposed downstream of said analog ΔΣ modulator and electrically connected in series to said analog ΔΣ modulator.

38. A circuit for converting an analog signal into a digital signal, comprising:

(a) a ΔΣ modulator;

(b) a pre-filter which filters an analog input signal and transmits the thus filtered analog input signal to said ΔΣ modulator;

(c) a decimation filter which filters an output signal transmitted from said ΔΣ modulator and transmits a digital output signal; and (d) a clock signal generator which supplies a clock signal to said ΔΣ modulator and said decimation filter, said ΔΣ modulator comprising:

(a) an analog ΔΣ modulator including:

(a1) a digital-analog converter which converts a one-bit feed-back signal to an analog signal;

(a2) an analog adder or subtracter which calculates a difference between an output signal transmitted from said digital-analog converter and an analog input signal;

(a3) an analog integrator which integrates output signals transmitted from said analog adder or subtracter; and (a4) a first quantizer which converts an output signal transmitted from said analog integrator, into a digital signal, and (b) a digital ΔΣ modulator including:
  (b1) a first digital adder or subtracter which calculates a difference between an output signal transmitted from said first quantizer and a one-bit feed-back signal;
  (b2) second to M-th digital adders or subtracters each of which calculates a difference between an output signal transmitted from the digital integrator disposed immediately upstream of the digital adder or subtracter, wherein M is an integer equal to or greater than 3;
  (b3) first to M-th digital integrators each of which integrates each of output signals transmitted from said first to M-th digital adders or subtracters;
  (b4) a second quantizer which converts an output signal transmitted from said M-th digital integrator, into a one-bit digital signal; and
  (b5) a delay element which delays an output signal transmitted from said second quantizer, and feeds the thus delayed output signal back to said analog ΔΣ modulator,
said digital ΔΣ modulator being disposed downstream of said analog ΔΣ modulator and electrically connected in series to said analog ΔΣ modulator.

39. A circuit for converting an analog signal into a digital signal, comprising:
  (a) a ΔΣ modulator;
  (b) a pre-filter which filters an analog input signal and transmits the thus filtered analog input signal to said ΔΣ modulator;
  (c) a decimation filter which filters an output signal transmitted from said ΔΣ modulator and transmits a digital output signal; and
  (d) a clock signal generator which supplies a clock signal to said ΔΣ modulator and said decimation filter,
said ΔΣ modulator comprising:
  (a) an analog ΔΣ modulator including:
    (a1) first to N-th digital-analog converters each of which converts a one-bit feed-back signal to an analog signal wherein N is an integer equal to or greater than 2;
    (a2) a first analog adder or subtracter which calculates a difference between an output signal transmitted from said first digital-analog converter and an analog input signal;
    (a3) a first analog integrator which integrates output signals transmitted from said first analog adder or subtracter;
    (a4) second to N-th analog adders or subtracters each of which calculates a difference between each of output signals transmitted from said second to N-th digital-analog converters and an output signal transmitted from an analog integrator disposed immediately upstream of the digital-analog converter;
    (a5) second to N-th analog integrators each of which integrates each of output signals transmitted from said second to N-th analog adders or subtracters; and
    (a6) a first quantizer which converts an output signal transmitted from said N-th analog integrator, into a digital signal, and
  (b) a digital ΔΣ modulator including:
    (b1) a first digital adder or subtracter which calculates a difference between an output signal transmitted from said first quantizer and a one-bit feed-back signal;
    (b2) second to M-th digital adders or subtracters each of which calculates a difference between an output signal transmitted from the digital integrator disposed immediately upstream of the digital adder or subtracter, wherein M is an integer equal to or greater than 3;
    (b3) first to M-th digital integrators each of which integrates each of output signals transmitted from said first to M-th digital adders or subtracters;
    (b4) a second quantizer which converts an output signal transmitted from said M-th digital integrator, into a one-bit digital signal; and
    (b5) a delay element which delays an output signal transmitted from said second quantizer, and feeds the thus delayed output signal back to said analog ΔΣ modulator,
said digital ΔΣ modulator being disposed downstream of said analog ΔΣ modulator and electrically connected in series to said analog ΔΣ modulator.

* * * * *